United States Patent [19]
Nagamoto et al.

[11] Patent Number: 5,373,534
[45] Date of Patent: Dec. 13, 1994

[54] SERIAL DATA RECEIVING APPARATUS

[75] Inventors: Shunichi Nagamoto; Takeshi Muramatu; Terue Matsumura, all of Nara, Japan

[73] Assignee: Matsushita Electric Industrial Co., Ltd., Osaka, Japan

[21] Appl. No.: 820,503

[22] Filed: Jan. 14, 1992

[51] Int. Cl.$^5$ .................. H04L 7/00; H03M 13/00
[52] U.S. Cl. .................. 375/106; 375/87; 375/95; 371/42
[58] Field of Search .................. 375/94–95, 375/106, 114–117, 55, 82, 87; 370/105.1, 105.3; 371/32, 42, 46

[56] References Cited

U.S. PATENT DOCUMENTS

| | | | |
|---|---|---|---|
| 3,760,355 | 9/1973 | Bruckert | 375/116 |
| 4,080,572 | 3/1978 | Hastings et al. | 375/95 |
| 4,242,755 | 12/1980 | Gauzan | 375/114 |
| 4,276,650 | 6/1981 | de Jager et al. | 375/110 |
| 4,472,686 | 9/1984 | Nishimura et al. | 375/94 |
| 4,514,854 | 4/1985 | Ashida | 375/94 |
| 4,567,604 | 1/1986 | Jacksier | 375/87 |
| 5,093,841 | 3/1992 | Vancraeynest | 375/116 |

Primary Examiner—Stephen Chin
Assistant Examiner—Young Tse
Attorney, Agent, or Firm—Stevens, Davis, Miller & Mosher

[57] ABSTRACT

This serial data receiving apparatus is intended to realize the receiving process of serial data having an inferior SN ratio with a simple arrangement and at low cost. A one-bit length of the serial data is divided into several blocks. The sampling data is input at the multiple points of each block by using a shift register built in a microcomputer. The data is temporarily held so that the data at the same number block of each block is accumulated for several bits. The accumulation of the data results in cancelling the noise components and leaving the original signal components. This overlapping type receiving system makes it possible to clarify the receiving phase of a preamble signal for bit synchronization and to establish the bit synchronization. Next, the sampling data signals are entered at the multiple points based on the resulting receiving timing and the logic value of the bit is determined according to the ratio of the number of values of "1" to "0" contained in the data. Further, by using the reversal symmetry of the first half and the second half of the bi-phase codes, it is possible to realize the methods for establishing bit synchronization and determining a logic bit more effectively and accurately.

15 Claims, 13 Drawing Sheets

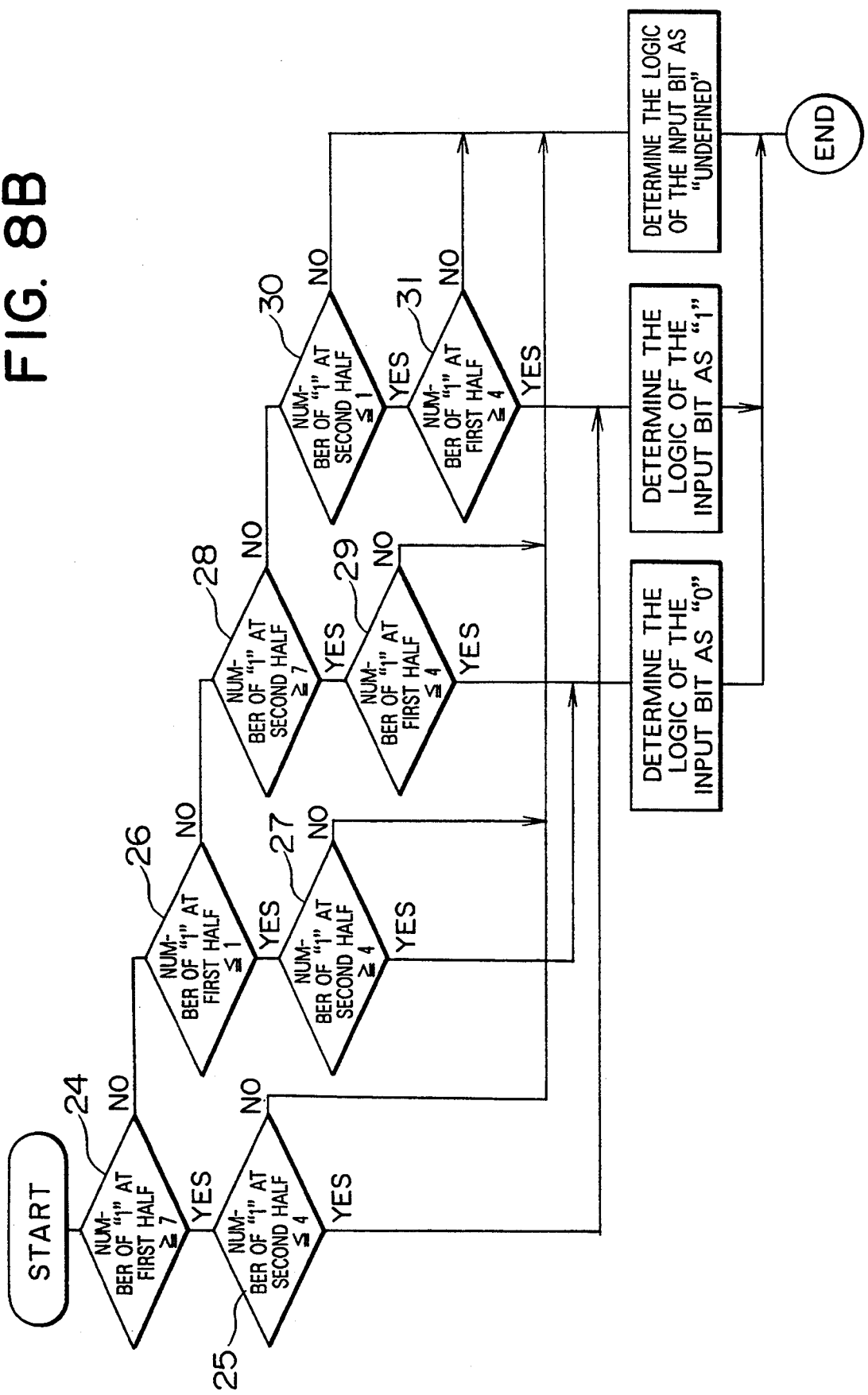

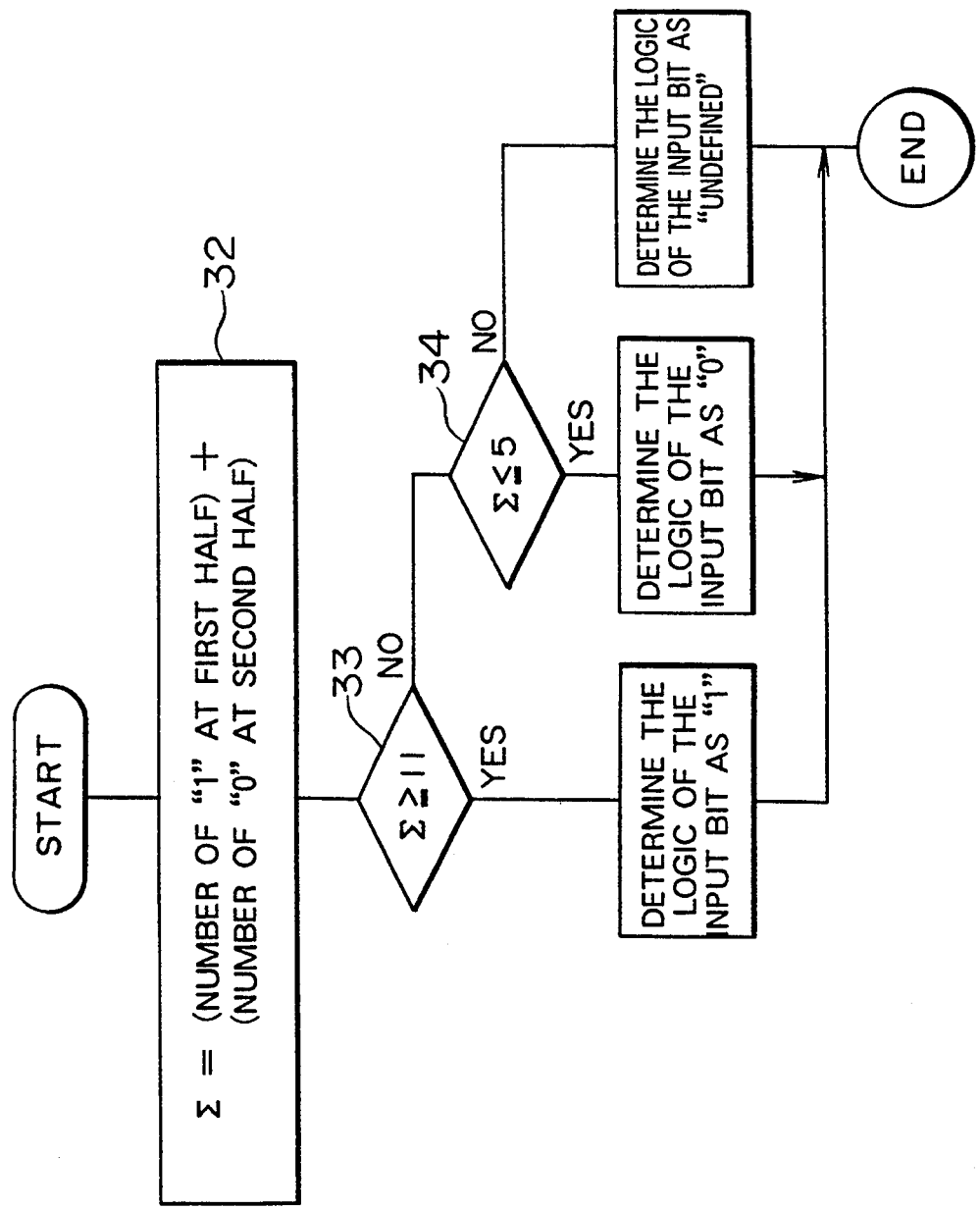

SERIAL DATA RECEIVING APPARATUS

BACKGROUND OF THE INVENTION

1. Field of the Invention

The present invention relates to a serial data receiving apparatus which is appropriate to receiving serial data having an inferior SN ratio as in a radio data communication through weak radio waves.

2. Description of the Prior Art

As a conventional example of such a serial data receiving apparatus, an asynchronous system receiver has been known. The asynchronous system is arranged so that as shown in FIG. 9, a trailing edge of a signal (point P) is assumed as a signal start point, and an sampling signal is input at the centers (C1, C2, C3, . . . ) of the bits where predetermined lag times (t1, t2, t3, . . . ) respectively have passed from the signal start point. The P point means a point where the bit synchronization is established.

In the conventional arrangement of the serial data receiving apparatus, however, it is impractical to establish the bit synchronization in the condition that the SN ratio of the data is so inferior as often bringing about noise on the data, because it is impossible to determine the actual trailing edge of the signal from the trailing portion resulting from the noise. Furthermore, though the use of a kind of means may establish the bit synchronization, the erroneous data inputting cannot be prevented if noise is located at the input point of the sampling signal.

For the conventional means for overcoming such a shortcoming, a noise filter has been often used. The filter serves to separate the noise from the signal in light of the frequency. It means that the ideal noise filter is arranged to enter the frequency components of the data itself and block the other frequency components. However, even such an ideal noise filter is incapable of preventing the noise having the same frequency components as the data. Hence, the use of the noise filter is not so effective in overcoming the shortcoming resulting from the noise.

As another method, there has been proposed a method for separating the signal from the noise by overlapping signals on time. In the field of satellite communication, there has been practically employed the method where a satellite transmits a signal again and again and a receiving apparatus on the earth adds the same signals transmitted from the satellite again and again and computes an average value of the added signals. The use of this method makes it possible to practically eliminate the adverse effect of the random noise components and restore a vivid signal.

To realize this method, a large-volume memory is required for temporarily storing the data transmitted from the satellite. Further, a high-speed processor is required for adding and averaging these data signals. In case that the budget disallows the use of an expensive high-speed processor, it takes a long time to do the computation. Hence, it is impractical to apply this technique to domestic equipment in light of the cost, and this technique cannot realize a real-time signal-transmitting facility like a remote control unit provided in the domestic equipment. The additional disadvantage of this technique is that since the same data signal is fired to the same space again and again for transmitting one piece of data, the transmitted data occupies the space during the signal-transmitting time and no other data is allowed to be transmitted. FIG. 10 is a sketch illustrating a remote control system of a spontaneous gas water heater to which the present invention applies. A gas water heater 101 is normally installed outside of wall or in a machine chamber. In the gas water heater 101, the gas supplied from the gas supply pipe 102 is combusted for heating the water supplied from a water pipe 103. The hot water is supplied through a hot water pipe 104 to a shower 107 located in a bathroom 105 or a faucet 108 provided in a kitchen 106. The bathroom 105 or the kitchen 106 provides remote control units 109 and 110 by which the hot water temperature is adjusted. The operation signals of the remote control units 109 and 110 are converted into radio signals 111, 112 and then are transmitted to the gas water heater 101 located behind walls 113 and 114. Conversely, the signal indicating a driving state signal of the gas water heater 101 is transmitted as a radio signal (not shown) to the remote control units 109 and 110. The driving state is indicated on an indicator. In case that the walls 113 and 114 contain a certain kind of metal material or the gas water heater 101 is located far apart from the bathroom 105 and the kitchen 106, the radio signals 111 and 112 become attenuated until they reach the bathroom 105 or the kitchen 106. This results in making the SN ratio of the signal inferior when the receiver (not shown) of the gas water heater 101 receives the signal.

As set forth above, the present invention is designed in the consideration that the receiver for receiving a serial data signal containing noise components on real time is applied to a relatively inexpensive commodity. For example, the present invention may apply to a home automation system including a security facility or a portable telephone in addition to the aforementioned remote control system of the domestic equipment or the home.

SUMMARY OF THE INVENTION

It is an object of the present invention to provide a serial data receiving apparatus which is capable of receiving a serial data signal containing noises, that is, having an inferior SN ratio positively and in real time.

It is a further object of the present invention to provide establishment of bit synchronization for receiving the serial data signal having an inferior SN ratio just on timing.

It is another object of the present invention to provide determination of a bit logic for accurately determining a logic of each 1 bit contained in the received serial data signal having an inferior SN ratio.

It is yet another object of the present invention to provide an inexpensive serial data receiving apparatus having the foregoing functions which employs such simple arrangement as being applied to the domestic equipment.

The serial data receiving apparatus according to the present invention is arranged to divide a one-bit length of the serial data into several blocks and rapidly enter sampling data at multiple points of each block by using a shift register. This process is continued for extension of several bits. The data at the same number block of each bit is accumulated for cancelling the noise components, thereby leaving the original signal components. The overlapping type receiving system can clearly establish the receiving phase of a preamble signal for bit synchronization, said preamble signal transmitted prior to the data signal, and accurately take bit synchronization. Based on the receiving timing points established on the bit synchronization, the shift register serves to input the sampling data signal at the multiple points. Then, the logic value of the bit is determined on the ratio of the number of the input data "1" to that of "0". In addition to the process for inputting the sampling data at the multiple points through the use of the shift register, the present invention can provide simple arrangement for speeding up the calculation of the number of "1" or "0" through the use of reference instructions of a ROM table contained in a microcomputer. Moreover, the invention can more effectively realize the accuracy by utilizing the reversal symmetry about a first half and a later half of bi-phase codes.

As set forth above, the present invention can provide an inexpensive and highly-efficient serial data receiving apparatus which uses a one-chip microcomputer having a shift register built therein without having to use an expensive circuit system such as a special filter or a phased lock loop.

BRIEF DESCRIPTION OF THE DRAWINGS

FIG. 8B is a flowchart showing another operation executed in the serial data receiver;

FIG. 8C is a flowchart showing another operation executed in the serial data receiver;

DESCRIPTION OF THE PREFERRED EMBODIMENTS

Figure 1:
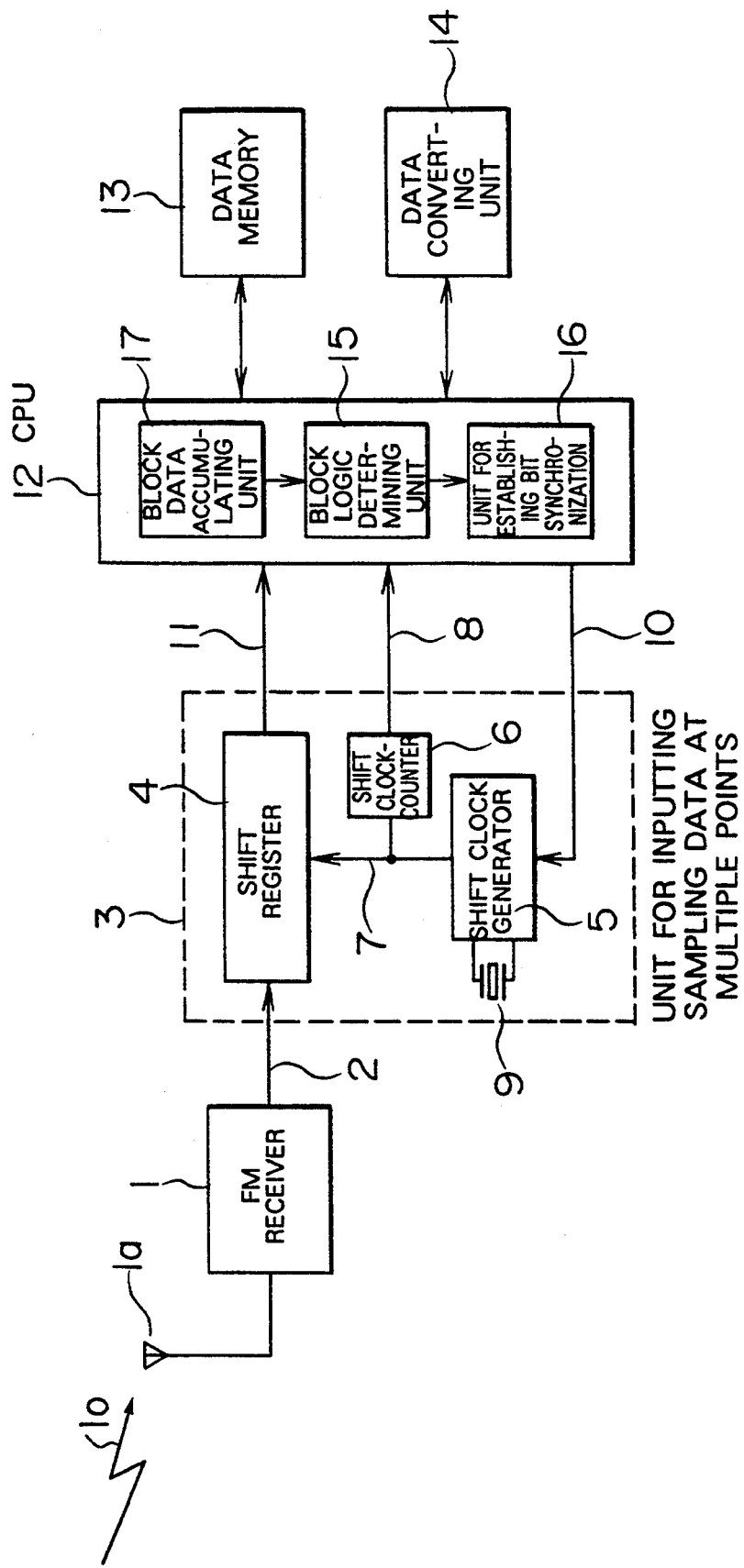
FIG. 1 is a block diagram showing a serial data receiver according to an embodiment of the present invention.

A serial data receiver according to an embodiment of the present invention is illustrated in a block diagram of FIG. 1. 1 denotes a pre-processing unit for receiving serial input data, which serves to convert a preamble signal for bit synchronization transmitted from a serial data transmitter (not shown) and a data signal following the preamble signal into a baseband serial data signal 2. As an example, consider that the pre-processing unit 1 is assumed as a FM receiver and a FM-modulated radio signal 1o is transmitted from the serial data transmitter. The radio signal 1o is caught by an antenna 1a and the FM receiver 1 serves to modulate the radio signal 1o into an original baseband type digital signal.

Figure 2:
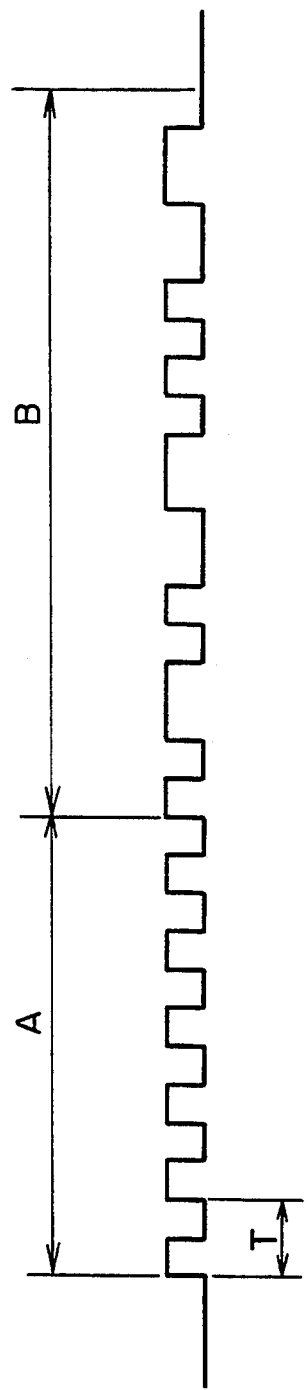
FIG. 2 is a waveform view showing a signal used in the serial data receiver.
Figure 3:
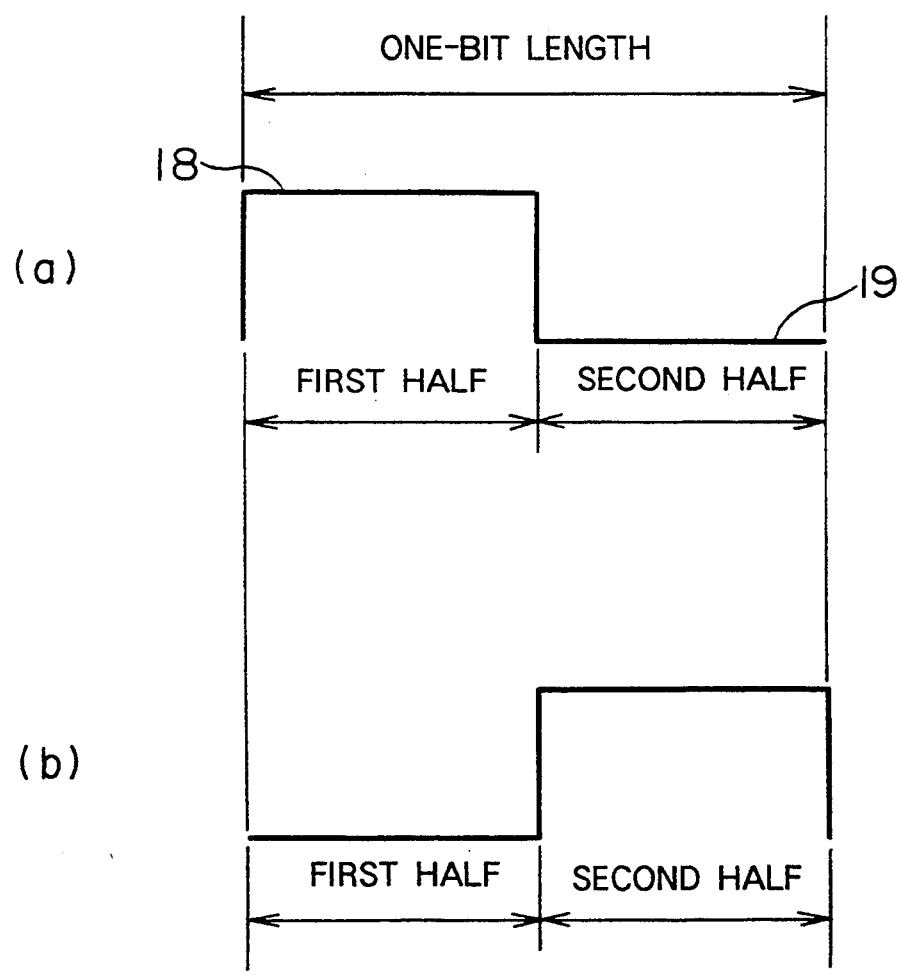
FIG. 3 is a waveform view showing another signal used in the serial data receiver.

FIG. 2 shows an embodiment of the serial data signal 2. In FIG. 2, an A part denotes a preamble signal for bit synchronization and a B part denotes a data signal. The preamble signal can be formed by continuous transmission of the bi-phase codes. An interval T corresponds to one bit of the bi-phase code. Turning to FIG. 3, (a) denotes a logic 1 of the bi-phase code and (b) denotes a logic 0. In case that such a bi-phase code is transmitted as a radio signal, the transmission frequency at the high-level part 18 of the bi-phase code can be modulated to f1, and the transmission frequency at the low-level part 19 can be modulated to f2.

Returning to FIG. 1, 3 denotes a unit for inputting sampling data at the multiple points. The unit 3 is arranged to have a shift register 4, a shift clock generator 5, and a shift clock counter 6. The serial data signal 2 is input to the shift register 4 at the sampling points as being synchronized with the shift clock signal 7 output from the shift clock generator 5. The counted pieces of sampling data are input and held in the shift clock counter 6. The shift clock counter 6 is arranged to output a signal indicating completion of a shifted input 8 when the shift clock signals 7 corresponding to the number of bit of the shift register 4 are input to the shift clock counter 6.

The shift clock generator 5 serves to properly divide an original oscillating frequency produced by a crystal oscillator 9 and produce a shift clock signal of a period $\Delta t1$. The generation/stop of the shift clock signal is controlled by a shift clock control signal 10 sent from a CPU 12. That is to say, the CPU 12 enables the shift clock generator 5 in response to the shift clock control signal 10, when the shift clock signal 7 is generated to start the serial data signal receiving process of the shift register 4. Then, the CPU 12 determines that the sampling input operation at multiple points is terminated when the shifted-input complete signal 8 is received and reads the sampling data signal 11.

Figure 4:
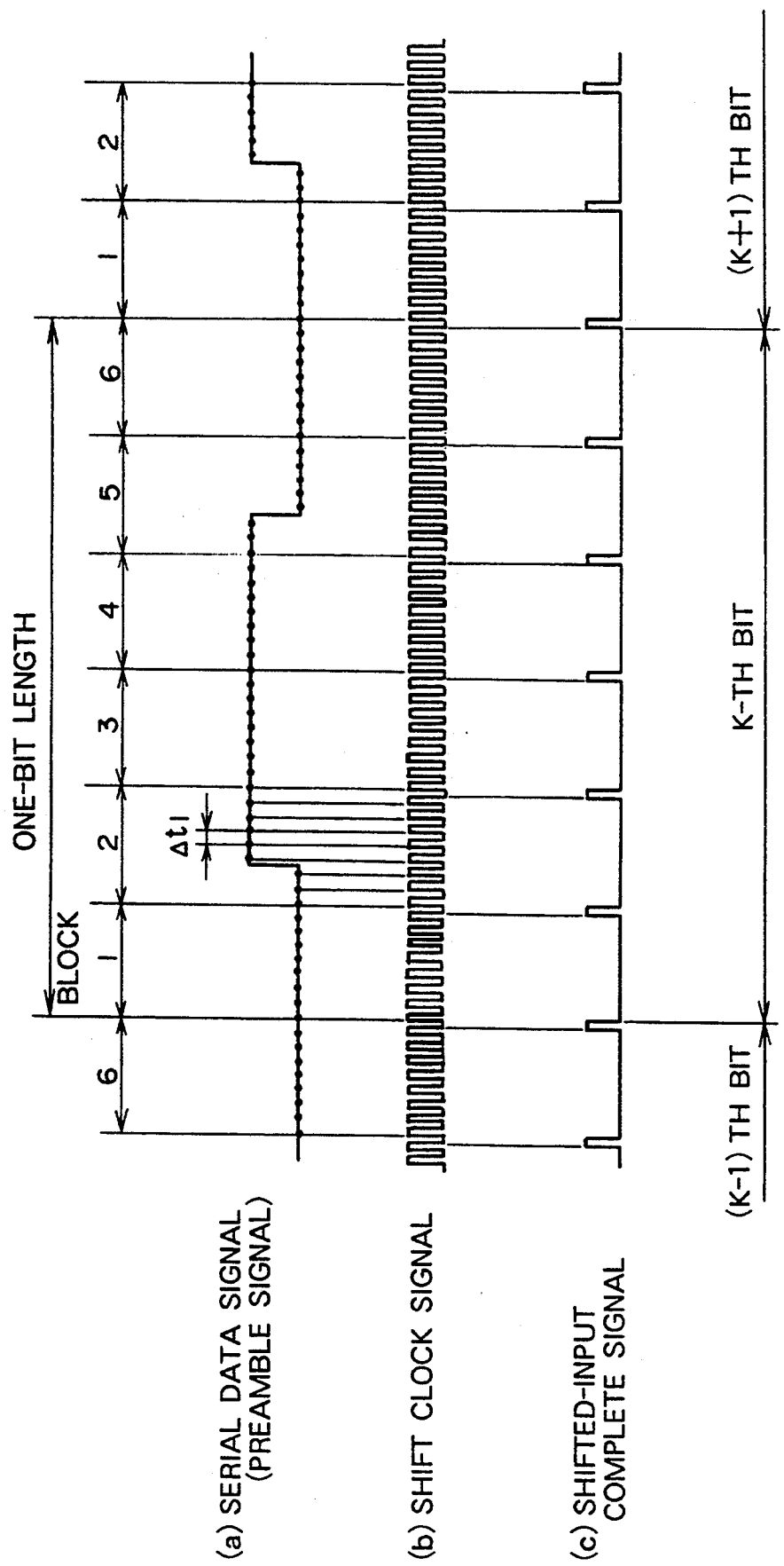
FIG. 4 is a timing view showing an operation executed in the serial data receiver.

FIG. 4 is a timing view showing operation of the unit 3 for inputting the sampling data at multiple points. In FIG. 4, (a) denotes a preamble signal portion of the serial data signal. (b) denotes a shift clock signal 7 and (c) denotes a shifted-input complete signal 8.

In this embodiment, the number of bits of the shift register 4 is assumed as 8. When eight shift clock signals 7 are fired, the shifted-input complete signal 8 is output. During the period of one bit of the preamble signal, six shifting input complete signals 8 are output. One bit of the preamble signal is divided into six blocks, and the sampling data at the eight points are captured for each block and are read in the CPU 12. For example, at the block No. 1 of the k-th bit, the sampling data is "00000000". At the block No. 2, the sampling data is "00011111". At the block No. 3, the sampling data is "11111111". Hence, the period $\Delta t1$ of the shift clock signal 7 corresponds to a time represented by dividing one-block length by the number of bits of the shift register 4 (in this embodiment, 8).

Again, turning to FIG. 1, a data memory 13 serves to temporarily store the sampling data read from the shift register 4 by the CPU 12. The stored sampling data is arranged according to each bit number and each block number.

14 denotes a data converting unit, which serves to calculate the number of "1" or "0" composing the sampling data read by the CPU 12. For example, for the input data of "00011111", the number of "1" is output as 5 (the number of "0" is output as 3).

In addition, the data memory 13 stores the sampling data read from the shift register 4 as it is or as the number of "1" or "0" converted from the sampling data by the data converting unit 14.

17 denotes a block data accumulating unit, which serves to accumulate the number of "1" or "0" of the sampling data calculated by the data converting unit for each block number. The accumulated value is always updated such as the latest 10 bits.

In turn, 15 denotes a block logic determining unit, which serves to determine the logic value of each block from the accumulated value of the input data "1" or "0" of each block number obtained by the block data accumulating unit 17. Table 1a shows the principle on which the block logic is determined and the embodiment in case of 1 bit. In actual use, for example, 10-bit blocks are accumulated for determining the block logic based on the specification shown in Table 1b. The logic determination can be easily realized by the program run in the microcomputer.

TABLE 1a

| Number of data 1 | Block logic value |
| --- | --- |
| 0 | 0 |
| 1 | 0 |
| 2 | 0 |
| 3 | Undefined |
| 4 | Undefined |
| 5 | Undefined |
| 6 | 1 |
| 7 | 1 |
| 8 | 1 |

TABLE 1b

| Number of data 1 | Block logic value |
| --- | --- |
| 0~27 | 0 |
| 28~52 | Undefined |
| 53~80 | 1 |

16 denotes a unit for establishing bit synchronization, which serves to obtain the phase relation between the preamble signal being input and the receiving timing of the CPU 12 from the serial patterns of the block logic value from the blocks No. 1 to No. 6 obtained by the block logic determining unit 15 and to establish the bit synchronization timing. This process can be easily realized by the program run in the microcomputer. Table 2 shows the specification of the phase relation and the serial patterns of the block logic values. The specification corresponds to the timing view of FIG. 5.

The line of the serial pattern number 1 in Table 2 indicates the case where the block logic values of the blocks Nos. 1 to 6 have the serial pattern of [1], [1], [1], [0], [0] and [0]. The phase lag between the data signal and the receiving timing in the CPU 12 is defined as 0. Hence, this pattern is a reference on which the block logic values indicate another serial pattern. The timing of this case corresponds to a part (a) of FIG. 5. Then, the line of the serial pattern number 2 of Table 2 indicates the case where the block logic values have the serial pattern of [undefined], [1], [1], [undefined], [0] and [0]. It indicates the receipt of the data signal lags behind the reference by 1/12 bit. The timing of this case corresponds to a part (b) of FIG. 5. The serial patterns of the block logic values indicated in Table 2 respectively correspond to parts (c) to (1) of FIG. 5 in the similar manner as above. ΔT of FIG. 5 indicates the processing error of the bit synchronization timing caused in the [undefined] part of the block logic value definition of Table 1. In this embodiment, the timing error is at most ±1/24 bit. To lessen the error, it is possible to increase the blocks in number.

TABLE 2

Figure 5:
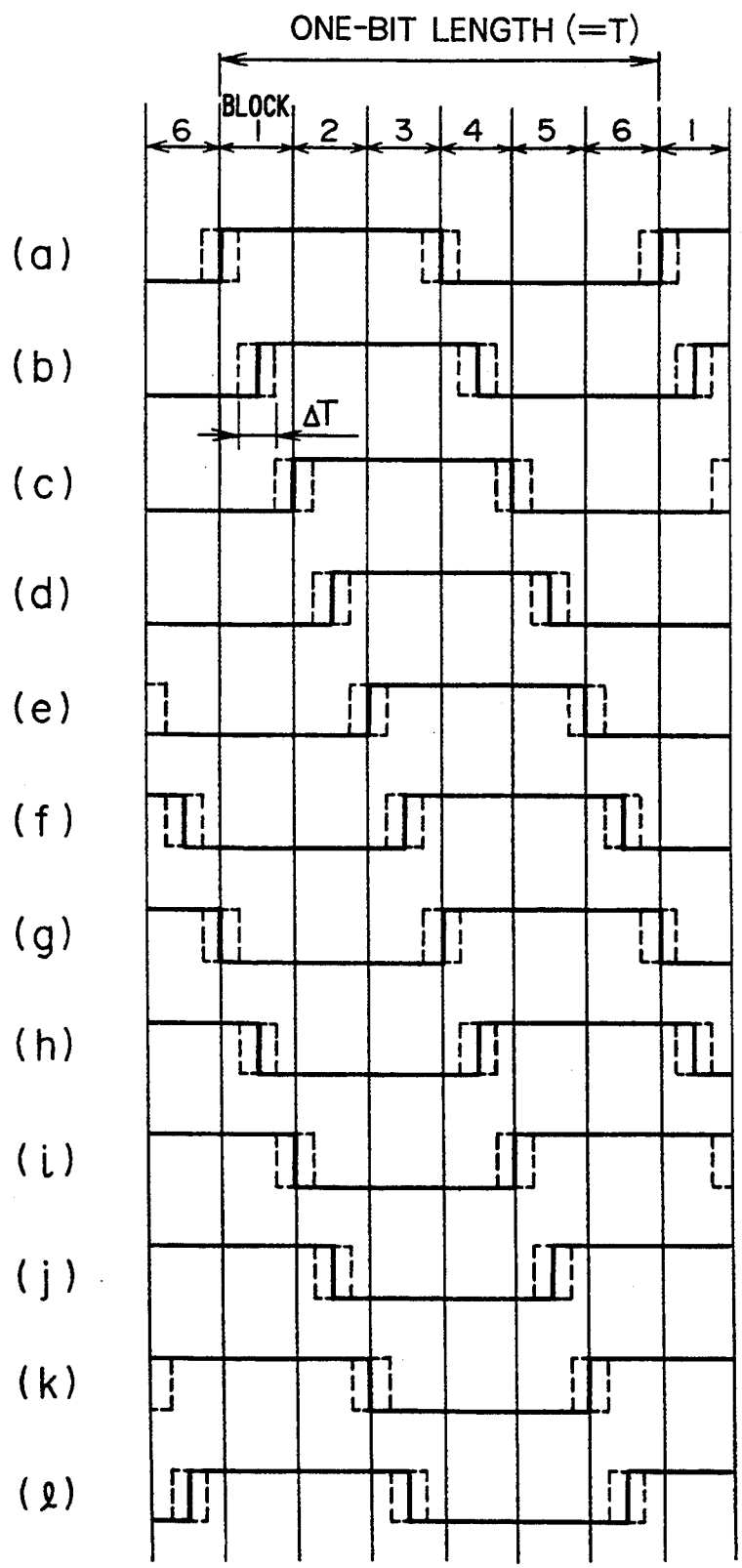
FIG. 5 is a timing view showing another operation executed in the serial data receiver.

| Serial pattern No. | Block No. | | | | | | Relative phase lag | Corresponding parts of FIG. 5 |
| --- | --- | --- | --- | --- | --- | --- | --- | --- |
| | 1 | 2 | 3 | 4 | 5 | 6 | | |
| 1 | 1 | 1 | 1 | 0 | 0 | 0 | 0 | (a) |
| 2 | x | 1 | 1 | x | 0 | 0 | $\frac{1}{12}$ | (b) |
| 3 | 0 | 1 | 1 | 1 | 0 | 0 | $\frac{2}{12}$ | (c) |
| 4 | 0 | x | 1 | 1 | x | 0 | $\frac{3}{12}$ | (d) |
| 5 | 0 | 0 | 1 | 1 | 1 | 0 | $\frac{4}{12}$ | (e) |
| 6 | 0 | 0 | x | 1 | 1 | x | $\frac{5}{12}$ | (f) |
| 7 | 0 | 0 | 0 | 1 | 1 | 1 | $\frac{6}{12}$ | (g) |
| 8 | x | 0 | 0 | x | 1 | 1 | $\frac{7}{12}$ | (h) |
| 9 | 1 | 0 | 0 | 0 | 1 | 1 | $\frac{8}{12}$ | (i) |
| 10 | 1 | x | 0 | 0 | x | 1 | $\frac{9}{12}$ | (j) |
| 11 | 1 | 1 | 0 | 0 | 0 | 1 | $\frac{10}{12}$ | (k) |
| 12 | 1 | 1 | x | 0 | 0 | x | $\frac{11}{12}$ | (l) | x denotes "undefined"

As set forth above, the present invention is designed to accumulate the sampling data corresponding to several bits of the preamble signal for each block number (that is, for each phase) and determine the block logic based on the accumulated data for the purpose of eliminating the random adverse effect of the noise and precisely determine the block logic based on the original signal components. Further, the preamble signal and the phase relation of each block, that is, the receiving timing, are sensed by the serial pattern of the block logic values obtained by the above manner for the purpose of establishing the bit synchronization timing. The established bit synchronization timing is a reference timing on which the preamble signal and the serial data thereafter are received. It results in making it possible to establish very accurate and stable bit synchronization against a low SN signal.

Next, another embodiment of the present invention will be described. As is obvious from FIG. 4, by using the bi-phase code as a preamble signal, at each combination of the first block and the fourth block, the second block and the fifth block and the third block and the sixth block, the input data is made to be the same in the ideal state with no noises merely by reversing the logic of the input data.

The other block logic determining unit 15 of this invention provides an arrangement for providing a block logic by relating the data at the i-th block to the block data at the (i+n)th block, wherein the number of the divided blocks is 2n (n is a natural number) and i is an integer meeting the relation of $1 \leq i \leq n$. Table 3 shows the principle on which the block logic is determined. The shown embodiment is concerned with one bit. In actual use, the block logic is determined by accumulating the blocks corresponding to ten bits. Hence, the number of "1" has a value corresponding to 10 bits for the determination.

TABLE 3

|  |  | Number of logic "1" at (i+n)th block | | | | | | | | |
|---|---|---|---|---|---|---|---|---|---|---|
|  |  | 0 | 1 | 2 | 3 | 4 | 5 | 6 | 7 | 8 |
| Number | 0 | x | x | x | x | 0 | 0 | 0 | 0 | 0 |
| of | 1 | x | x | x | x | x | 0 | 0 | 0 | 0 |
| logic | 2 | x | x | x | x | x | x | 0 | 0 | 0 |
| "1" at | 3 | x | x | x | x | x | x | x | 0 | 0 |
| the | 4 | 1 | x | x | x | x | x | x | x | 0 |
| i-th | 5 | 1 | 1 | x | x | x | x | x | x | x |
| block | 6 | 1 | 1 | 1 | x | x | x | x | x | x |
|  | 7 | 1 | 1 | 1 | 1 | x | x | x | x | x |
|  | 8 | 1 | 1 | 1 | 1 | 1 | x | x | x | x | x denotes "undefined"

Another embodiment of the block logic determining unit 15 provides an arrangement for determining a logic of the block based on the i-th block data and a reversed value of the (i+n)th block data. Table 4 shows the specification for determining the phase relation between the serial pattern and the preamble signal based on the block logic value as related to FIG. 5.

TABLE 4

| Serial pattern No. | Block No. | | | Relative phase lag | Corresponding parts of FIG. 5 |
|---|---|---|---|---|---|
|  | 1(4) | 2(5) | 3(6) |  |  |
| 1 | 1 | 1 | 1 | 0 | (a) |
| 2 | undefined | 1 | 1 | $\frac{1}{12}$ | (b) |
| 3 | 0 | 1 | 1 | $\frac{2}{12}$ | (c) |
| 4 | 0 | undefined | 1 | $\frac{3}{12}$ | (d) |
| 5 | 0 | 0 | 1 | $\frac{4}{12}$ | (e) |
| 6 | 0 | 0 | undefined | $\frac{5}{12}$ | (f) |
| 7 | 0 | 0 | 0 | $\frac{6}{12}$ | (g) |
| 8 | undefined | 0 | 0 | $\frac{7}{12}$ | (h) |
| 9 | 1 | 0 | 0 | $\frac{8}{12}$ | (i) |
| 10 | 1 | undefined | 0 | $\frac{9}{12}$ | (j) |
| 11 | 1 | 1 | 0 | $\frac{10}{12}$ | (k) |
| 12 | 1 | 1 | undefined | $\frac{11}{12}$ | (l) |

As described above, if the logic determination is carried out on the basis of the i-th block data and the (i+n)th block data of the accumulated block data corresponding to the latest predetermined bits, the logic is determined on the doubled data, so that the bit synchronization can be established very accurately and stably. This embodiment is concerned with the case of $2n=6$, that is, $n=3$, wherein one bit of the preamble signal is divided by six blocks.

As described in the foregoing embodiments, the preamble signals composed of bi-phase codes are accumulated for each block number of each bit. Since the block logic is determined on the accumulated block data, the accurate bit synchronization can be efficiently realized.

Figure 6:
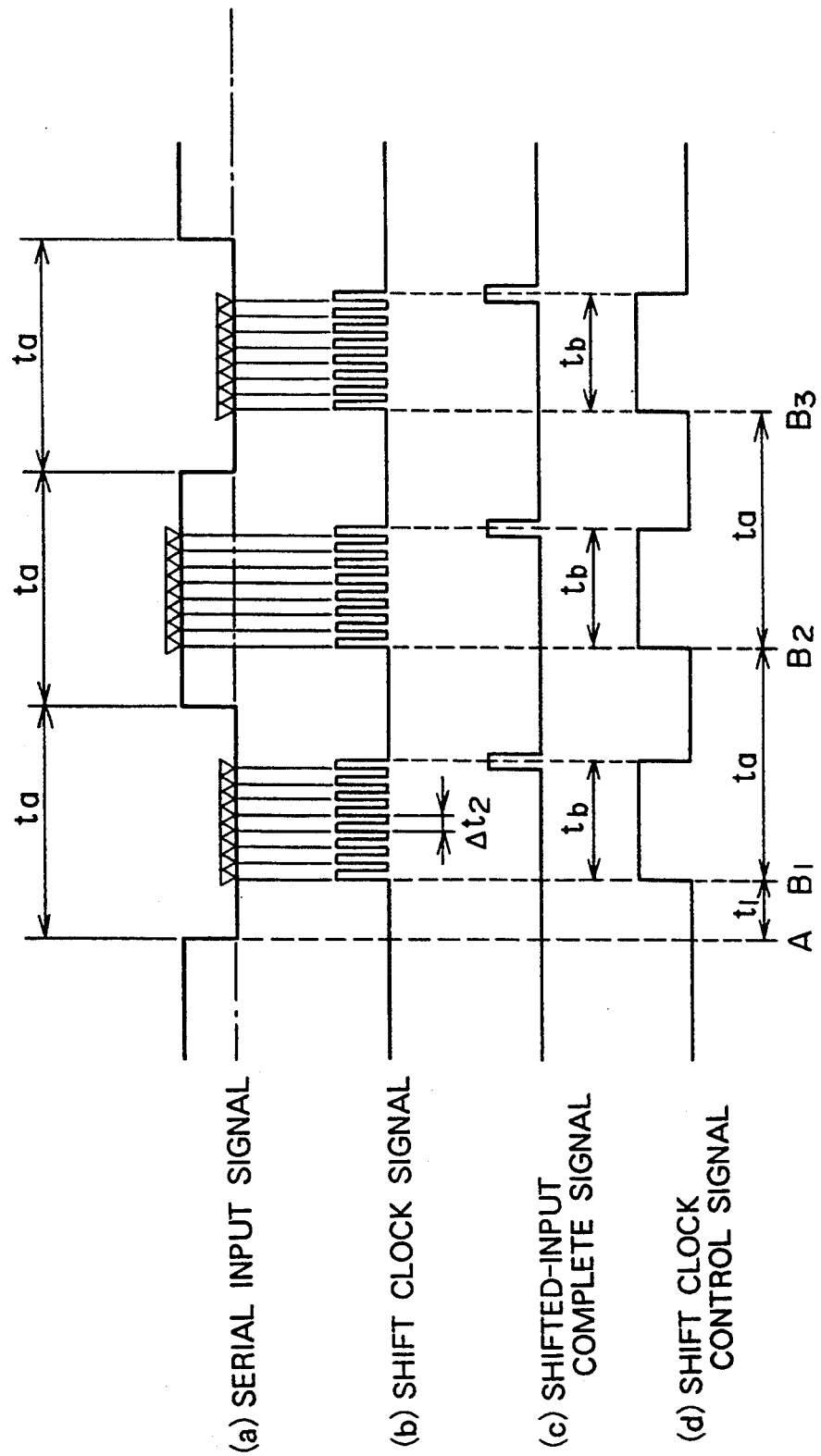
FIG. 6 is a timing view showing another operation executed in the serial data receiver.

Next, the method for receiving the preamble signal and the data signal thereafter and determining the logic of these signals will be described with reference to FIG. 6. In FIG. 6, a part (a) denotes a serial input signal 2, a part (b) denotes a shift clock signal 7, a part (c) denotes a shifted-input complete signal 8, a part (d) denotes a shift clock control signal 10. An A point in FIG. 6 is a synchronization-establishing point obtained by the foregoing process. With this A point as a reference point, the sampling input is done for each bit of a data signal. Then, the shift clock generator 5 is started at the points B1, B2, B3, . . . . Those are respectively the points where predetermined lag times t1 (corresponding to $\Delta T/2$ or more of FIG. 5 for eliminating the adverse effect of the processing error of the bit synchronization timing), t1+ta, t1+2ta, . . . pass from the A point. With the shift clock generator 5 being started, the input data is automatically input to the shift register 4. ta denotes a ½ bit length of the serial input signal 2. The generating time tb of the shift clock signal 7 is made to be $(ta-\Delta T)$ or less. The period $\Delta t2$ becomes:

$\Delta t2 = tb$/number of bits of shift register (8 in this embodiment)

The foregoing arrangement makes it possible to do the sampling data corresponding to the number of bits of the shift register 4 as eliminating the adverse effect of the synchronization-establishing error ($\Delta T/2$) during the interval of the serial input data ½ bit. In addition, FIG. 6 shows the embodiment where the data is input when the bi-phase codes are used as the serial input data. In FIG. 6, hence, the sampling data corresponding to the number of bits of the shift register 4 is input for each ½ bit of the data signal. However, it goes without saying that this invention is not limited to this embodiment and also includes an arrangement for entering the sampling data corresponding to the number of bits of the shift register 4 during the one-bit length of the data signal.

After the shift clock signal 7 corresponding to the number of bits of the shift register 4 is output, the shifted-input complete signal 8 is output to the CPU 12 on the timing as shown in FIG. 6(c). The CPU 12 serves to control the shift clock control signal 10 on the timing shown in FIG. 6(d). Hence, the CPU 12 is capable of doing another work during the tb period when at least the shift clock control signal 10 is being output without having to do the receiving process.

Figure 7:
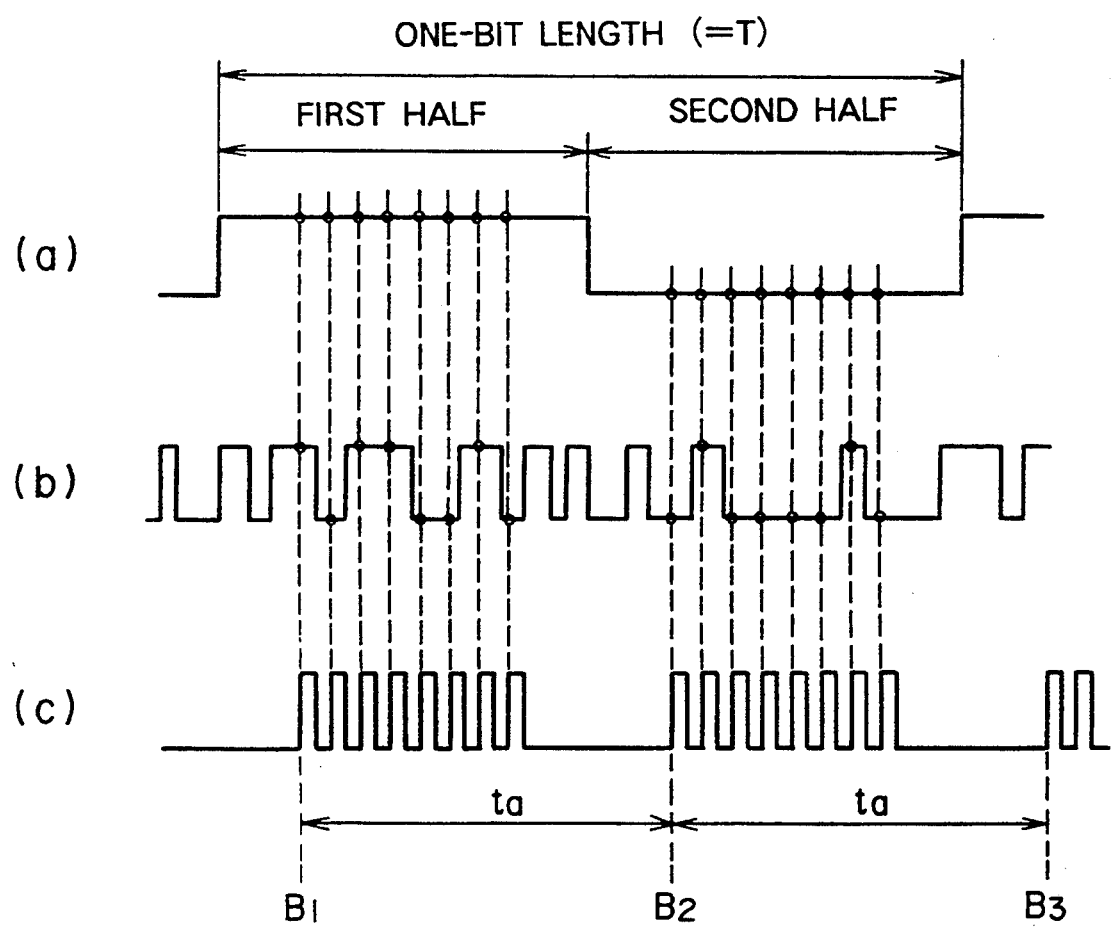
FIG. 7 is a timing view showing another operation executed in the serial data receiver.

The method for inputting a data signal and determining the logic of the data signal will be concretely described with reference to FIG. 7. The parts (a) and (b) of FIG. 7 indicate a one-bit serial data signal composed of bi-phase codes output from the serial data pre-processing unit 1 such as the FM receiver and input to the shift register 4. The part (a) of FIG. 7 indicates an ideal data signal with no noise. The part (b) exemplarily shows a signal input with the noise. By supplying the shift clock signal (C) output from the shift clock generator 5 to the shift register 4, it is possible to determine the timing on which the serial data shown in the parts (a)

and (b) of FIG. 7 is entered as sampling data at the multiple points.

The number of sampling inputs is defined by the number of bits of the shift register 4. In this embodiment, the number is 8. The input data of 8 samples can be obtained respectively at the first half and the second half of the bi-phase codes on the timing shown in FIG. 7. In FIG. 7, a point B1 is a sampling start point of the bit first half defined from the reference point obtained by the foregoing bit-synchronizing process. A point B2 is a sampling start point of the second half. The time from B1 to B2 and the time ta from B2 to the sampling start point B3 of the first half of the next bit are determined depending on a data transmission speed.

The shift clock signal 7 in FIG. 7(c) is controlled by the shift clock control signal 10 sent from the CPU 12. After the shift clock signal 7 corresponding to the number of bits of the shift register 4 (8 in this embodiment) is output, the shifted-input complete signal 8 is supplied to the CPU 12. When the shifted-input complete signal is input, the CPU 12 determines that the sampling input at the multiple points is terminated, reads the sampling data held in the shift register 4 through the data bus 11 and determines the logic of the bit based on the read data. For example, the sampling data in the state of the ideal input data is composed of "11111111" at the first half and "00000000" at the second half. As shown in FIG. 7(b), however, the input data containing noises thereon is composed of "10110010" at the first half and "01000010" at the second half.

Next, from the sampling data, the number of "1" or "0" contained in the data is calculated by the data converting unit 14. For example, in case of the input data shown in FIG. 7(a), the number of "1" at the first half is 8, the number of "0" at the first half is 0, the number of "1" at the second half is 0, and the number of "0" at the second half is 8. As in FIG. 7(b), the number of "1" at the second half is 4, the number of "0" at the first half is 4, the number of "1" at the second half is 2, and the number of "0" at the second half is 6.

The data converting unit 14 provides a data conversion table as shown in Table 5. That is to say, the data input and held to the shift register 4 is assumed as an input value, and the number of "1" contained in the input value is output.

TABLE 5

|   | Input value (Sampling data) | Output value (Number of logic "1") |
|---|---|---|
| 0 | 0 0 0 0 0 0 0 0 | 0 |
| 1 | 0 0 0 0 0 0 0 1 | 1 |
| 2 | 0 0 0 0 0 0 1 0 | 1 |
| 3 | 0 0 0 0 0 0 1 1 | 2 |
| 4 | 0 0 0 0 0 1 0 0 | 1 |
| 5 | 0 0 0 0 0 1 0 1 | 2 |
| 6 | 0 0 0 0 0 1 1 0 | 2 |
| . | . | . |
| . | . | . |
| . | . | . |
| 253 | 1 1 1 1 1 1 0 1 | 7 |
| 254 | 1 1 1 1 1 1 1 0 | 7 |
| 255 | 1 1 1 1 1 1 1 1 | 8 |

In this embodiment, since the number of bits of the shift register 4 is 8, it is necessary to prepare 256 data table areas. That is to say, the input value is an 8-bit address and the output value corresponding to each address (input value) is stored in a memory area (ROM). Hence, by specifying the address with the input value, it is possible to immediately obtain the number of "1" contained in the output value, that is, the input value.

If the resulting output value is more than a predetermined reference, therefore, the input data is determined as a logic "1". If it is less than the reference, it is determined as a logic "0". If the output value is out of the reference, it is determined as "undefined". In actual use, the data conversion table can be easily realized by using the ROM table reference instructions of the microcomputer. The shift register 4, the shift clock generator 5 and the shift clock counter 6 can be implemented to have simple and inexpensive arrangement if the microcomputer having their functions on a single chip is used.

In turn, the foregoing data inputting process and the logic determining process will be descrimped with reference to the flowchart for executing the program of the CPU 12.

Figure 8A:
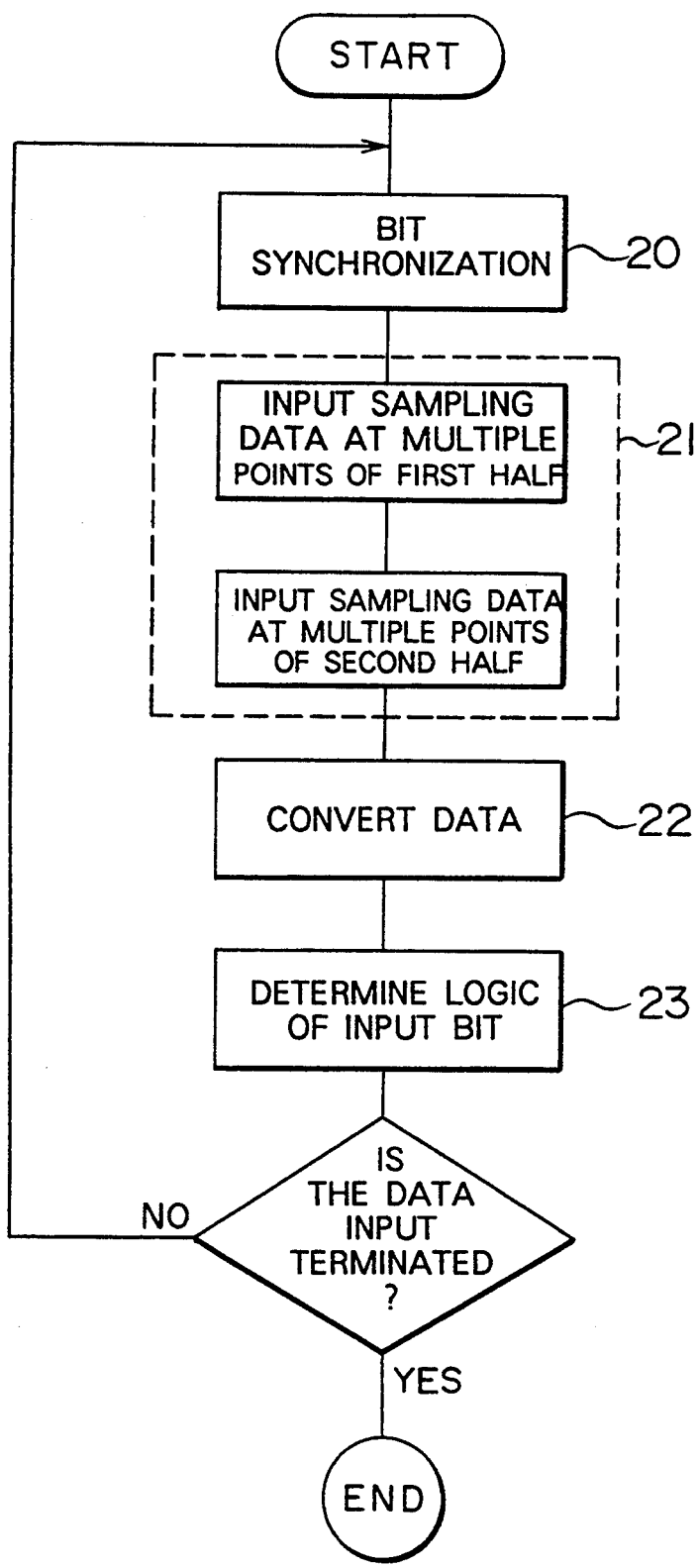
FIG. 8A is a flowchart showing an operation executed in the serial data receiver.
Figure 9:
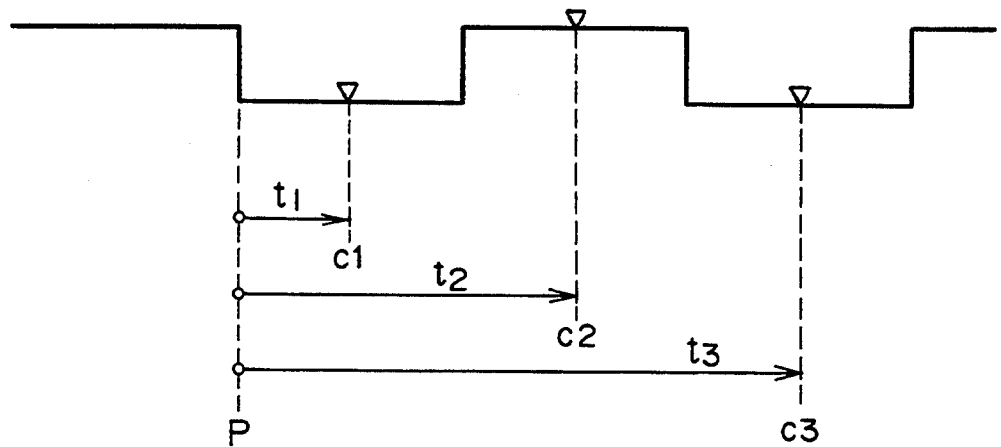
FIG. 9 is a timing view showing an operation executed in the prior art.
Figure 10:
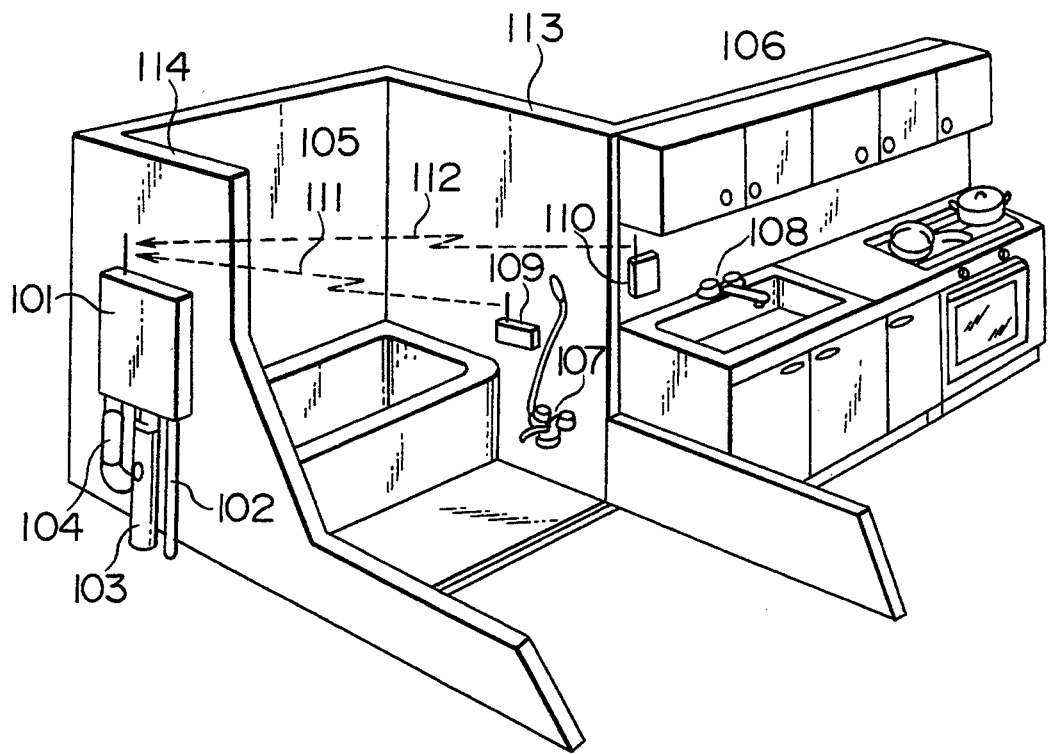
FIG. 10 is a sketch illustrating the domestic equipment to which the present invention applies.

In FIG. 8A, 20 denotes a bit-synchronizing process. The sampling input unit 3 operates to establish the reference point on which the sampling start point is determined. 21 denotes the sampling process at the multiple points of the first and the second halves by starting the shift clock generator 5. 22 denotes a process which reads the sampling data from the shift register 4 and calculates the number of "1" contained in the data through the shift register 4. 23 denotes a process which determines the logic of the bit based on the number of "1" obtained by the data converting unit 14.

With reference to FIGS. 8B and 8C, the first and the second algorithms for determining the bit will be described. The first algorithm shown in FIG. 8B is configured on the idea that if one of the first half and the second half of the bi-phase codes contains noises, the logic of the bit is established if the other half holds the accurate data. The second algorithm shown in FIG. 8C is configured on the idea that if both of the first and the second halves contain noises, the logic of the bit is determined by the accumulated values of the data of the first half and the logically reversed value of the data of the second half.

Both of the algorithms are configured to determine the logic of the bit based on the reversal symmetry of the bi-phase codes by using the sampling data of the first half and the second half. In the process shown in FIG. 8B, at a step 24, it is determined whether or not the number of "1" at the first half of the sampling data is 7 or more. If yes, at a step 25, it is determined whether or not the number of "1" at the second half is 4 or less. In this embodiment, the sampling number is 8. Hence, if the number of "1" at the second half is 4 or less, the logic of the bit is determined as "1". If it is 5 or more, the logic of the bit is determined as "undefined". The "undefined" is prepared for preventing erroneous determination if the difference between the data at the first half and at the second half is reduced to zero. The determination of bit logic at the steps 26 to 31 is carried out in the same manner as above. Table 6 shows the specification for determining the bit logic according to the first algorithm.

TABLE 6

|  |  | Number of logic "1" at second half |  |  |  |  |  |  |  |
|---|---|---|---|---|---|---|---|---|---|
|  |  | 0 | 1 | 2 | 3 | 4 | 5 | 6 | 7 | 8 |
| Number | 0 | x | x | x | x | 0 | 0 | 0 | 0 | 0 |
| of | 1 | x | x | x | x | 0 | 0 | 0 | 0 | 0 |
| logic | 2 | x | x | x | x | x | x | x | 0 | 0 |
| "1" at | 3 | x | x | x | x | x | x | x | x | 0 |

TABLE 6-continued

| | | Number of logic "1" at second half | | | | | | | |
|---|---|---|---|---|---|---|---|---|---|
| | | 0 | 1 | 2 | 3 | 4 | 5 | 6 | 7 | 8 |
| first | 4 | 1 | 1 | x | x | x | x | x | 0 | 0 |
| half | 5 | 1 | 1 | x | x | x | x | x | x | x |
| | 6 | 1 | 1 | x | x | x | x | x | x | x |
| | 7 | 1 | 1 | 1 | 1 | 1 | x | x | x | x |
| | 8 | 1 | 1 | 1 | 1 | 1 | x | x | x | x | x denotes "undefined"

At the process of FIG. 8C, at a step 32, the number of values of "1" at the first half is added with the number of reversed values of "1", that is, values of "0" and the added values are accumulated. Then, at steps 33 and 34, it is determined whether the accumulated value is 11 or more or 5 or less. If it is or more, the logic value of the bit is determined as "1" and if it is 5 or less, the logic value of the bit is determined as "0". If it belongs to the range except the above ranges, the logic of the bit is determined as "undefined". Table 7 indicates the specification for determining the bit logic based on the second algorithm.

TABLE 7

| | | Number of logic "1" at second half | | | | | | | |
|---|---|---|---|---|---|---|---|---|---|
| | | 0 | 1 | 2 | 3 | 4 | 5 | 6 | 7 | 8 |
| Number | 0 | x | x | x | 0 | 0 | 0 | 0 | 0 | 0 |
| of | 1 | x | x | x | x | 0 | 0 | 0 | 0 | 0 |
| logic | 2 | x | x | x | x | x | 0 | 0 | 0 | 0 |
| "1" at | 3 | 1 | x | x | x | x | x | 0 | 0 | 0 |
| first | 4 | 1 | 1 | x | x | x | x | x | 0 | 0 |
| half | 5 | 1 | 1 | 1 | x | x | x | x | x | 0 |
| | 6 | 1 | 1 | 1 | 1 | x | x | x | x | x |
| | 7 | 1 | 1 | 1 | 1 | 1 | x | x | x | x |
| | 8 | 1 | 1 | 1 | 1 | 1 | 1 | x | x | x | x denotes "undefined"

In the above description, the number of sampling inputs has been defined as 8, but this invention is not limited to this defined number. The reference numerical values for determining the logic of a bit are not defined to the values described in the above embodiment.

In turn, the effect of the invention will be described with reference to the experimental data.

Figure 11:
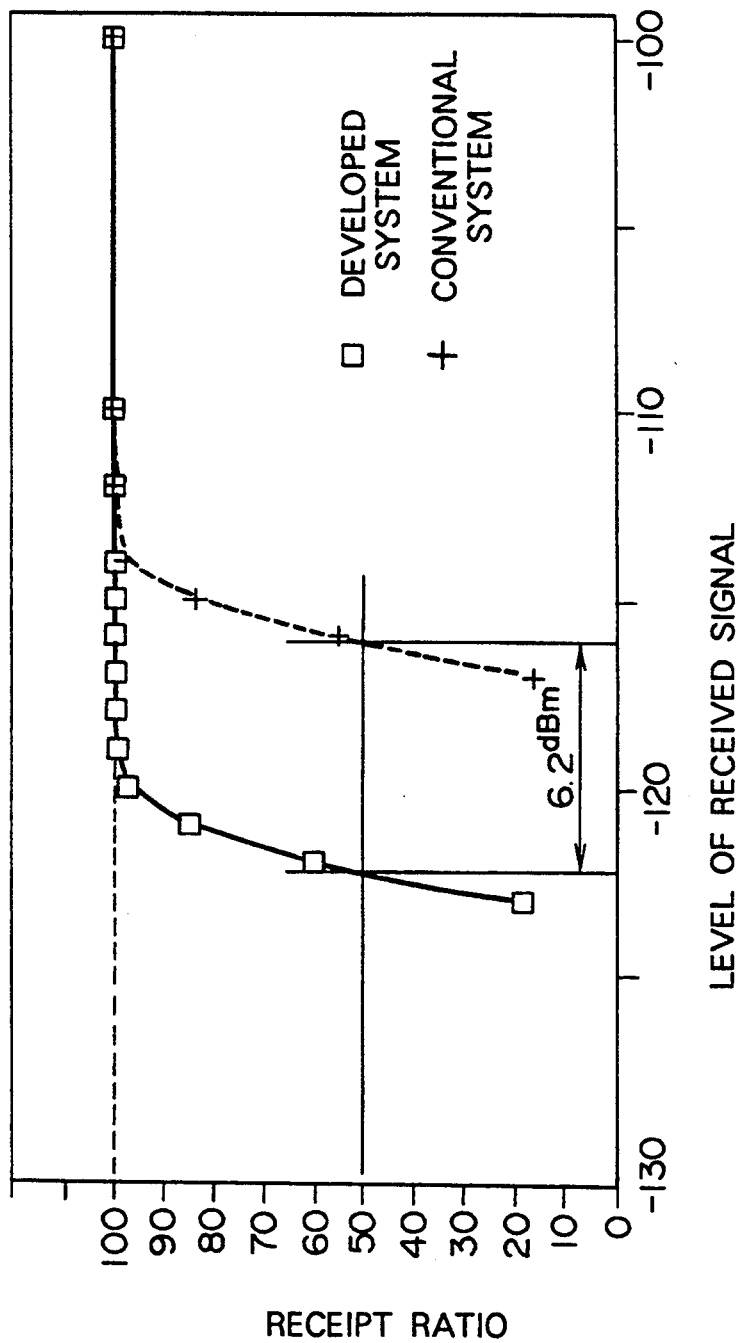
FIG. 11 is a graph showing data about the performance comparison between a wave signal receiver of the invention and a wave signal receiver of the prior art.

FIG. 11 shows the data about compared performances between the receiver developed according to the present invention and the receiver employing a conventional filter system. The conventional receiver uses a remote control encoder IC made by Motorola, MC145026 as a transmission control unit of the transmitter and a remote control decoder IC made by Motorola, MC145027 as a receipt control unit of the receiver. This decoder MC145027 includes two RC filters. The time constant of the first filter is set to be longer than a one-bit length of a signal transmitted from the encoder MC145026 and serves to detect the termination of signal packets being transmitted. The first filter is capable of removing a single-shot noise. The time constant of the second filter is set to determine the signal of "1" from that of "0" both of the signals having respective pulse widths. The second filter, therefore, serves to remove the noises having the different pulse widths from those of the signal "1" or "0".

In the foregoing conventional receiver and the system of this invention, the data was transmitted from both of the transmitters 1000 times, and the receipt ratio of each receiver was measured. The receipt ratio means a ratio of the accurately received data to the other data. In addition, the measurements were carried out as varying the strength of a radio signal fired by the transmitter. According to the measured data, the system developed by the invention can offer more performance by about 6 dB than the conventional system. In general, the attenuation of a radio signal is inversely proportional to the distance. The 6 dB more receipt performance means that the travel of a radio signal is doubled. It means that this power-up is very effective.

As set forth above, the present invention can offer a quite useful serial transmission system implemented by an inexpensive one-chip microcomputer having a shift register built therein.

What is claimed is:

1. A serial data receiving apparatus comprising:
    multiple samplings input means for receiving a serial signal, said serial signal comprising a preamble logical signal for bit synchronization and a serial data signal subsequent to said preamble logical signal, dividing a predetermined one-bit time length of said preamble logical signal by a natural number N to define N blocks of said serial signal with block numbers 1 through N within said one-bit predetermined time length, and sampling signal data at multiple sampling points of each of said blocks;
    block logic value determination means for determining a logic value of each of said N blocks as "1", "0" or "undefined" based on the signal data sampled by said multiple samplings input means; and
    bit synchronization means for identifying a bit synchronization phase of said preamble logical signal in accordance with logic values of said N blocks determined by said block logic value determination means to detect a phase relation between said preamble logical signal and either one of an end time point of an Nth block of said N blocks and a start time point of a first block of said N blocks and for establishing bit synchronization of said serial signal in accordance with said phase relation.

2. The serial data receiving apparatus according to claim 1, wherein said natural number N is even (N=2n, n=1,2,3,4,5, ... ).

3. The serial data receiving apparatus according to claim 2, wherein said block logic value determination means determines a logic value of an i-th block based on the sampled signal data at the i-th (an integer of $1 \leq i \leq n$) block and the sampled signal data at the (i+n)th block, and wherein said bit synchronization means derives said phase relation based on a serial pattern of the logic values of each of said i-th blocks ($1 \leq i \leq n$) obtained by said block logic value determination means.

4. The serial data receiving apparatus according to claim 1, wherein said multiple samplings input means samples said signal data at the multiple points of each of said blocks over two or more bits of said preamble logical signal for bit synchronization, and wherein said block logic value determination means comprises block data accumulating means for accumulating the sampled signal data of blocks having a common block number for each of said two or more bits, and said block logic value determination means determines the logic value of each of the blocks of said two or more bits based on the accumulated sampled signal data for each block number obtained by said block data accumulating means.

5. The serial data receiving apparatus according to claim 1, wherein said multiple samplings input means comprises:

a shift register having a capacity of a predetermined number of bits for sequentially shifting and holding said serial signal bit by bit; and a shift clock generator for generating a shift clock signal to control shifting and holding operating timings of said shift register;

said shift clock signal having a period shorter than a time obtained by dividing one half of said predetermined one-bit time length by the predetermined number of bits of said shift register.

6. The serial data receiving apparatus according to claim 5, further comprising a shift clock counter for counting pulses of said shift clock signal and for generating a shifted-input complete signal to control reading of said shift register when counting a number of said pulses of said shift clock signal equal to the predetermined number of bits of said shift register.

7. The serial data receiving apparatus according to claim 5, further comprising means for counting a number of values of "1" (or "0") in a portion of the serial signal which is held in said shift register to obtain a counted value and outputting said counted value to said block logic value determination means, said block logic value determination means determining said logic value of said each of said N blocks based on said counted value.

8. The serial data receiving apparatus according to claim 5, further comprising means for counting a number of values of "1" (or "0") in a portion of said serial signal which is held in said shift register by using a data conversion table which lists a plurality of possible bit combinations for said portion of said serial signal and in each of said plurality of possible bit combinations, and for outputting said number of values of "1" (or "0") in said portion of said serial signal to said bit logic value determination means, said bit logic value determination means determining a logic value of said portion of said serial signal.

9. A serial data receiving apparatus comprising:

sampling means for sampling data at multiple points of a first half and a second half of each bit contained in a serial data stream of bi-phase codes;

data converting means for counting a number of values of "1" (or "0") occurring in the data sampled at said multiple points by said sampling means; and bit logic determining means for determining a logic value of said each bit from the number of values of "1" (or "0") counted in the first half and the second half of said each bit counted by said data converting means.

10. The serial data receiving apparatus according to claim 9, wherein said bit logic determining means determines the logic value of said each bit in accordance with one of the first half and the second half of said each bit whose logic can be determined with greater certainty from a ratio of said numbers of values of "1" and "0".

11. The serial data receiving apparatus according to claim 9, wherein said bit logic determining means determines the logic values of said each bit by summing up the number of values of "1" (or "0") counted in the first half of said each bit and the number of values of "0" (or "1") counted in the second half of said each bit.

12. The serial data receiving apparatus according to claim 9, wherein said sampling means comprises:

a shift register having capacity of a predetermined number of bits for sequentially shifting an holding said serial data stream bit by bit; and a shift clock generator for generating a shift clock signal to control shifting and holding operating timings of said shift register;

said shift clock signal having a period shorter than a time obtained by dividing one half of a predetermined period of time needed to transmit each said bit by the predetermined number of bits of said shift register.

13. The serial data receiving apparatus according to claim 12, further comprising a shift clock counter for counting pulses of said shift clock signal and for generating a shifted-input complete signal to control reading of said shift register when counting a number of pulses of said shift clock signal equal to the predetermined number of bits of said shift register.

14. The serial data receiving apparatus according to claim 12, wherein said data converting means counts a number of values of "1" (or "0") in a portion of the serial data stream which is held in said shift register to obtain a counted value and outputs said counted value to said bit logic determining means for determination of said logic value of said each bit based on said counted value.

15. The serial data receiving apparatus according to claim 12, wherein said data converting means counts said number of values of "1" (or "0") by using a data conversion table which lists a plurality of possible bit combinations for a portion of said serial data stream held in said shift register and a number of values of "1" (or "0") in each of said plurality of possible bit combinations.

* * * * *